US005609914A

United States Patent [19]
Ma et al.

[11] Patent Number: 5,609,914
[45] Date of Patent: Mar. 11, 1997

[54] METHOD FOR PREPARING HIGH RESOLUTION POLYIMIDE IMAGES USING NON-PHOTOSENSITIVE LAYERS OF POLY(AMIC ACID) OR SALTS THEREOF

[75] Inventors: Sheau-Hwa Ma, Chaddsford; Walter R. Hertler, Kennett Square, both of Pa.; Howard E. Simmons, III, Wilmington, Del.

[73] Assignee: E.I. Du Pont de Nemours and Company, Wilmington, Del.

[21] Appl. No.: 433,275

[22] Filed: May 2, 1995

[51] Int. Cl.[6] .................................................. B05D 5/06
[52] U.S. Cl. ........................ 427/264; 427/273; 427/353
[58] Field of Search ..................................... 427/145, 269, 427/273, 353; 503/200

[56] References Cited

U.S. PATENT DOCUMENTS 5,270,078  12/1993  Walker et al. ........................ 427/264
5,466,653  11/1995  Ma et al. ............................. 503/200

*Primary Examiner*—Michael Lusignan

[57] ABSTRACT

A method for preparing high resolution wash-off polyimide images is described having the sequential steps of (a) providing a non-photosensitive layer containing a substantially non-crystalline poly(amic acid) polymer or salt thereof on a substrate; (b) applying an aqueous ink imagewise to the non-photosensitive layer to change the solubility in the ink-applied areas, the aqueous ink containing a solubility altering agent; (c) washing the non-photosensitive layer with an aqueous solution to remove the soluble areas; and (d) converting the poly(amic acid) polymer to a polyimide.

21 Claims, No Drawings

METHOD FOR PREPARING HIGH RESOLUTION POLYIMIDE IMAGES USING NON-PHOTOSENSITIVE LAYERS OF POLY(AMIC ACID) OR SALTS THEREOF

FIELD OF THE INVENTION

The invention relates to a method for preparing high resolution wash-off images and, more particularly, to a method for preparing high resolution polyimide images from a non-photosensitive layer containing poly(amic acid) or salts thereof.

BACKGROUND OF THE INVENTION

Polyimides commonly are used as interlayer insulators, protective layers, or etch masks in the manufacture of electronic components because of their superior heat and chemical resistance, and dielectric properties. Photoresist compositions used to create patterned polyimide film for these applications are well known in the art. Such polyimide films typically are deposited from a solution as a coating. When exposed imagewise to light, solubility of the film is altered in the imaged areas.

The polyimide film resists generally are negative-working, but may be positive-working. Negative-working embodiments primarily are based on polyimides or polyimide precursors, such as polyamic esters containing ethylenically unsaturated double bonds (e.g., acrylic ester moieties in the side chain). The acrylic moieties crosslink during uv irradiation, causing exposed regions to become insoluble in organic solvents. Unexposed regions remain soluble in organic solvents, and thus are removed by the appropriate solvent. Large quantitites of solvent are needed for complete removal of the unexposed regions and resolution of the developed image is limited due to swelling of the crosslinked exposed regions.

Most of the positive-working polyimide resists that have been reported are based on the standard quinonediazide photochemistry and poly(amic acid) wherein the solubility of poly(amic acid), in alkaline developer solution is inhibited by the quinonediazide compounds. Irradiation renders the exposed areas soluble in the developer solution. However, it is known that such resist formulations usually have a limited storage life because the quinonediazide compounds decompose relatively rapidly in the presence of acid. Moreover, the difference in solubility between the exposed and unexposed areas is relatively small and their stability to alkaline development and etching solutions is unsatisfactory.

Incorporation of photoactive groups is another approach that has been used in positive-working polyimide resists. An example is the o-nitrobenzyl ester of poly(amic acid) in which the o-nitrobenzyl ester groups are photochemically converted to acid groups, rendering the imaged areas more soluble in an alkaline developer solution.

The prior art methods discussed above are based on photochemical processess that depend upon the use of unfriendly materials, such as monomers, and delicately balanced photosensitive formulations. Also, elaborate synthesis is required to prepare the photoactive polyimide precursors. The processes are usually complex, involving the preparation of a photomask, exposure with registraion, and development. The finished product may not have all the desired mechanical and electrical properties because compromises usually are needed to achieve the desired photochemical properties.

The present invention overcomes many of these disadvantages and provides a process which poses minimal environmental risks, is easy to use and has the capability of rapidly producing images of high resolution.

SUMMARY OF THE INVENTION

The invention provides a method for preparing high resolution wash-off polyimide images by the sequential steps of:
(a) providing a non-photosensitive layer on a substrate, said non-photosensitive layer containing substantially non-crystalline poly(amic acid) polymer or a salt of the substantially non-crystalline poly(amic acid) polymer;
(b) applying an aqueous ink imagewise to the non-photosensitive layer to change its solubility, said aqueous ink comprising an aqueous carrier medium and a solubility altering agent;
(c) washing the non-photosensitive layer with an aqueous solution to remove the soluble areas of the non-photosensitive layer; and
(d) curing the poly(amic acid) polymer to form a polyimide.

When the non-photosensitive layer is a substantially non-crystalline poly(amic acid) polymer, the solubility altering agent is salt-forming agent (e.g. a base). When the non-photosensitive layer is a salt of the substantially non-crystalline poly(amic acid) polymer, the solubility altering agent is an acid-forming agent (e.g., an acid) that converts the salt back to its water insoluble acid form.

In the preferred embodiments, the aqueous ink is applied using an ink jet printer.

DETAILED DESCRIPTION OF THE INVENTION

The present invention provides several advantages over the prior art described above. For example, the present invention is more environmentally sound than the prior art because it utilizes aqueous solutions for pattern formation and element development. Therefore, waste disposal does not require solution treatment as required with solvent based systems and volatile solvent vapors are greatly reduced or eliminated. In addition, the present process does not use potentially toxic monomers, and is safer and easier to use. No additional heating or exposure steps are required, other than thermal or chemical curing of the poly(amic acid) polymer to form a polyimide, and no yellow light area is needed during processing.

Images formed by the present process have surprisingly good resolution and sharp edges. The element can be washed to develop the image immediately after the image layer has been applied, which greatly simplifies the process and improves efficiency. Alternatively, the element can be stored with the latent image intact for an indefinite period of time prior to being developed with an aqueous solution, since the reaction between the solubility altering agent and the non-photosensitive layer forms a stable non-photosensitive layer.

Non-Photosensitive Layer

The non-photosensitive layer comprises a poly(amic acid) polymer or salt thereof which is capable of forming the water-soluble salt of the poly(amic acid) polymer or the polymer, respectively, when reacted with the aqueous inks discussed hereinbelow. Moreover, the polymer must be insoluble in water in its non-salt form and soluble in water in its salt form.

Another requirement is that the polymer be substantially non-crystalline to facilitate the diffusion of the solubility altering agent present in the aqueous ink into the non-photosensitive layer. As used herein, the term "substantially non-crystalline" means that the polymer has no more than about 50% crystallinity.

It is contemplated that, before the image is developed, a second layer of pattern may be applied to add/correct image information by applying additional solubility altering agent in selected areas. If the non-photosensitive layer comprises a poly(amic acid) polymer and the aqueous ink comprises a salt-forming agent, for example, the image may be added to or corrected by applying additional salt-forming agent in selected areas. Or, the image may be deleted by adding an aqueous ink that contains agents capable of neutralizing the salt-forming agent in a selected area to render that area non-developable again. Examples of such compounds are acids, such as acetic acid.

Poly(AMIC ACID) Polymer—Precursor of Polyimide

Poly(amic acid) is easily prepared by reacting a tetracarboxylic dianhydride with a diamine in an organic solvent.

The tetracarboxylic dianhydride may be represented by the formula:

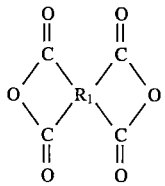

wherein $R_1$ is a tetravalent organic group having 2 to 22 carbon atoms. For example, aliphatic or alicyclic tetracarboxylic dianhydrides can be selected to advantage. Useful examples include, but are not limited to, butanetetracarboxylic dianhydride, pentanetetracarboxylic dianhydride, hexanetetracarboxylic dianhydride, cyclobutanetetracarboxylic dianhydride, cyclopentanetetracarboxylic dianhydride, bicyclohexanetetracarboxylic dianhydride, cyclopropanetetracarboxylic dianhydride, and methylcyclohexanetetracarboxylic dianhydride.

The use of an aromatic tetracarboxylic dianhydride can afford a poly(amic acid) that can be converted to a polyimide with superior physical properties. Examples of useful aromatic tetracarboxylic dianhydrides include, but are not limited to, 2,2'-bis(3,3',4,4'-biphenyl)hexaflurorpropane dianhydride (6-FDA), 3,3',4,4'-benzophenonetetracarboxylic dianhydride (BTDA), pyromellitic dianhydride (PMDA), 3,4,9,10-perylenetetracarboxylic dianhydride, 4,4'-sulfonyldiphthalic dianhydride, 3,3',4,4'-biphenyltetracarboxylic dianhydride (BPDA), 1,2,5,6-naphthalenetetracarboxylic dianhydride, 2,3,6,7-naphthalenetetracarboxylic dianhydride, 1,4,5,8-naphthalenetetracarboxylic dianhydride, and 2,3,5,6-pyridinetetracarboxylic dianhydride, and mixtures thereof. Many of the dianhydrides are commercially available.

The diamine used in the present invention may be represented by the formula:

$$H_2N-R_2-NH_2$$

where $R_2$ is a divalent organic group having 1 to 22 carbon atoms. Useful examples include, but are not limited to, 4,4'-oxydianiline (ODA), 4,4'-diaminodiphenylmethane, 4,4'-diaminodiphenylsulfone, 4,4'-diaminodiphenyl sulfide, m-phenylenediamine (MPD), p-phenylenediamine, 2,4-diaminotoluene, 2,5-diaminotoluene, 2,6-diaminotoluene, benzidine, 3,3'dimethylbenzidine, 3,3'-dimethylbenzidine, 3,3'dimethoxybenzidine, o-tolidine, 4,4"-diaminoterphenyl, 1,5-diaminonaphthalene, 2,5-diaminopyridine, 3,3'- dimethyl-4,4'-diaminodiphenylmethane, 4,4'-bis(p-aminophenoxy) biphenyl, 2,2-bis[4-(p-aminophenoxy) phenyl]propane, and hexahydro-4,7methanoindanylene dimethylenediamine, and mixtures thereof.

The use of a siloxanediamine represented by the following formula also can improve the adhesion to an organic substrate:

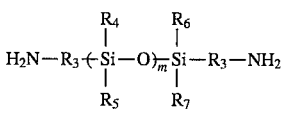

wherein $R_3$ is a divalent organic group having 1 to 10 carbon atoms, $R_4$, $R_5$, $R_6$ and $R_7$ which may be the same or different, are each a monovalent organic group having 1 to 10 carbon atoms, and m is an integer of 1 to 10. The siloxane diamine is used usually in an amount of 1 to 20 mole percent of the total amount of diamine. If the concentration of siloxanediamine is too low, it may not produce the desired improvement on adhesion. If the concentration is too high, the heat resistance will degrade. Selection of the proper amount depends on the system and the substrate used, and is readily determined by routine experimentation. An example of a useful siloxanediamine is bis-3-(aminopropyl)tetramethylsiloxane.

The organic solvent used for the synthesis is preferably also a good solvent for the resulting poly(amic acid). Polar solvents such as N-methyl-pyrrolidone, N,N-dimethylacetamide, N,N-dimethyl-formamide, dimethyl sulfoxide, tetramethylurea, or hexamethylphosphoric triamide, may be selected to advantage. Other commonly used organic solvents, such as ketones, esters, ethers, and halogenated hydrocarbons, also can be used to practice the invention. Useful examples include acetone, methyl ethyl ketone, methyl isobutyl ketone, cyclohexanone, methyl acetate, ethyl acetate, butyl acetate, diethyl oxalate, diethyl malonate, diethyl ether, ethylene glycol dimethyl ether, tetrahydrofuran, dichloromethane, 1,2-dichloroethane, 1,4-dichlorobutane, trichloroethane, chlorobenzene, o-dicholorobenzene.

The poly(amic acid) may be isolated for later use, or preferably used "as is" prepared in solution form. Some useful poly(amic acids) described above are commercially available from E. I. Du Pont (Wilmington, Del.) under the trade name of Pyralin®.

The number of acid groups on the poly(amic acid) may be reduced to improve physical properties for handleability and moisture sensitivity during storage, or to obtain better development latitude. This can be accomplished by partial imidization, partial esterification, or use of blends of poly(amic acid) with its ester derivatives.

The poly(amic acid) polymer may be present in the amount of up to 100%, preferably 50 to 100%, based on the total weight of the non-photosensitive layer.

Salt of the Poly(AMIC ACID) Polymer

Negative images are generated by employing a salt of the poly(amic acid) polymer in the non-photosensitive layer.

The poly(amic acid) described above can be reacted with bases to convert the acid groups to their salt form which is soluble in an aqueous solution. It is important that the salt form of the polyamic acids still have film forming properties so that the resulting non-photosensitive layer is strong enough to be handled. This can be accomplished by carefully choosing the monomers used to prepare the polyamic acid, controlling the acid content of the polymer, and selecting the bases for converting the polymer to its salt form. Properties such as Tg, molecular weight and crystallinity of the polymer, and comparability of the polymer with the salt forming bases are important factors to consider, and one skilled in the art can optimize such properties by routine experimentation.

For reasonable storage life, the salt form of the polyamic acid should be stable. Bases of low volatility should be used. However, the stability of the non-photosensitive layer needs to be balanced with the ease of removal of the by-products in the non-imaged areas during the image development and the curing or imidization step as the residual by-products might adversely affect the properties important to the end use. Salts of low formula weight from reaction between the salt forming agents for the polymer and the acids in the ink layer are the expected by-products. Examples of useful salt forming agents for the polyamic acid are bases similar to those described later. The amount of the salt forming agent must be sufficient to make the polymer soluble in the aqueous coating solution and subsequently in the developer solution, which will vary depending upon the acid content of the polymer, the composition of the polymer, and other ingredients of the coating solution.

The salt of the poly(amic acid) polymer may be present in the amount of up to 100%, preferably 50 to 100%, based on the total weight of the non-photosensitive layer.

Additives

The poly(amic acid) polymers, and salts thereof, described above are film-forming (i.e., when coated, they form films), and can contain a variety of additives provided that the selected additive(s) do not adversely affect the film performance. For example, plasticizers, polymeric modifiers, adhesion promoters, coating aids, chelating compounds for metal contamination, and inorganic fillers to improve hardness may be included, depending upon the desired application.

Representative plasticizers, that may be selected include dibutyl phthalate, di-n-octyl phthalate, etc., phosphates such as tributyl phosphate tricresyl phosphate, etc.; and benzoates such as benzyl benzoate, ethylene glycol dibenzoate, etc. Examples of useful inorganic filler are silica and zirconia in their colloidal form. The amount of these inorganic fillers should not be too high to impede the coating properties.

When the non-photosensitive layer contains the poly(amic acid) polymer, it may be desirable to partially convert the polymer to the water-soluble salt form to increase its susceptibility to the action of the solubility altering agent for the polymer (i.e. the salt-forming agent). In this instance, care should be exercised to ensure that the additives will not interfere with the salt-forming reaction between the polymer and the salt-forming agent in the ink, and that such additives do not render the non-photosensitive composition water-soluble. The poly(amic acid) or salt thereof and the additives are completely dissolved and the inorganic fillers are uniformly suspended in a suitable solvent to prepare a coating solution.

Colorants

If a precolored element is desired, one or more colorants can be present in the non-photosensitive layer. Dyes and pigments may be used as colorants. Dyes are known to have superior color properties such as chroma and transparency, but usually are not as lightfast as pigments. Water soluble dyes such as acid dyes, direct dyes, and basic dyes can be used to advantage because they can be washed off during the development step.

Useful pigments comprise a wide range of organic and inorganic pigments. It is preferable for the pigment particles to be dispersed and stabilized with a dispersant, preferably a polymeric dispersant. A high quality dispersion can be conveniently prepared using many conventional milling techniques and selection of a suitable dispersant. Caution should be taken that the dispersant does not contain functional groups which will interact with poly(amic acid) or the salt thereof, as this may impede the interaction between the solubility altering agent and poly(amic acid) or salt thereof or adversely affect the coating quality by flocculating the pigment dispersion. Small pigment particle size will be very desirable for maximum color strength, transparency, and dispersion stability.

The type of colorant and the amount thereof are selected based on the hue, color strength and purity, lightfastness, solubility or dispersability in the chosen coating solvent, and other properties desired for the intended applications. A detailed list of commercial dyes and pigments can be found in the "Buyer's Guide For Textile Chemists and Colorists", published by American Associate of Textile Chemists and Colorists, Research Triangle Park, N.C.

Plasticizers

In a preferred embodiment, a plasticizer is included to facilitate the penetration of the solubility altering agents and to adjust the film forming properties in the non-photosensitive layer. A plasticizer is selected to have reasonable compatibility with the polymer or salt thereof and other components of the film composition.

Useful plasticizers are well known to those skilled in the art and are commercially available. In general, water insoluble plasticizers are preferred for greater high humidity storage stability and environmental operating latitude, but are not required. The plasticizer may be present in an amount effective for the intended purpose, and the optimal level can be determined experimentally.

Polymeric Modifiers

The non-photosensitive layer composition may contain additional polymeric materials to modify adhesion, flexibility, hardness, moisture sensitivity and other mechanical or chemical properties required during its processing or end use. For formulations having improved environmental latitude, the selection of a polymeric modifier may depend on its Tg. The Tg of a polymer is affected by the chemical structures of the main chain and the side groups. Polymers with rigid structures generally show high Tg's while more flexible polymers exhibit lower Tg's. Polymers of desired Tg may be obtained by copolymerization of proper combinations of rigid and flexible monomers. The Tg's of many well known polymers are summarized in Section III of "POLYMER HANDBOOK", ed. J. Brandrup & E. H. Immergut, John Wiley & Sons, Inc., 1975, pp. 140–192.

The polymeric modifier may be present in an effective amount for the intended purpose, but the amount should not be too high so as to impede the solubility characteristics of the non-photosensitive layer. It is advantageous for the polymeric modifier to have limited compatibility with the poly(amic acid) or salt thereof present in the non-photosensitive layer to create a two-phase layer, provided it does not adversely affect the properties required for the end use. The interfaces between the two phases will facilitate diffusion of the solubility altering agent into the non-photosensitive layer. Plasticizers may also be used for this function.

Depending upon the composition of the non-photosensitive layer, either an aqueous or solvent medium may be used to prepare the composition for coating on the selected substrate. The poly(amic acids) can be dissolved in an aqueous solution by reaction with a volatile salt-forming agent, e.g. ammonium hydroxide, which will evaporate upon drying, leaving the neutral, water insoluble polymer on the substrate. The salts of poly(amic acids) can be easily dissolved in an aqueous solution. Similarly, suitable solvents may be selected which will dissolve the components of the non-photosensitive layer and which will evaporate after coating. The non-photosensitive layer may be coated onto the substrate using a variety of conventional, well known coating techniques such as extrusion die, doctor knife, wire wound bar, spin coating; printing techniques such as screen printing, gravure printing, lithographic printing, or simply by dipping the substrate into the coating solution or spraying the coating solution onto it. The coating may be dried by air, heat, vacuum, or combinations of these methods. Care should be taken when heat is applied so that the temperature does not get high enough to induce imidization.

Substrate

Virtually any substrate which is capable of withstanding the aqueous developing step and the curing step of the present process may be used in practicing this invention. The selection of a particular substrate will, of course, depend upon the intended application.

The substrates may be a semiconductor such as silicon or gallium-arsenic, an inorganic insulator such as alumina ceramic or glass ceramic, a metal such as aluminum, copper or steel, or an organic insulator such as a polyimide film. The surface of the substrate may be treated with a bonding material such as a silane coupling agent to improve the adhesion between the coating including the cured finished polyimide coating and the substrate.

Aqueous Inks

In the process of the present invention, the aqueous ink is preferably applied to the non-photosensitive layer using ink jet printing techniques. Ink jet printing is a non-impact printing process in which an electronic signal produces droplets of ink that are deposited on a substrate. Ink jet printers are broadly utilized as output for personal and other computers due to their reliability, print quality, low cost, relatively quiet operation and graphics capability. Ink jet printers apply ink in very small drops allowing for potentially high resolution image formation. They also have potential for high throughput in very fast systems affording a deposition rate of in excess of a million drops per second per nozzle. Further, ink jet systems are less expensive than any other currently available commercial system that allows high speed generation of patterns by bit mapped graphics. These attributes also make ink jet printing an attractive digital method for generating images such as in computer driven patterning systems.

Although ink jet printing is the preferred method of applying the aqueous ink layer, it is to be understood that the invention is not limited to ink jet printing. Rather, the imagewise layer may also be applied with conventional writing implements (e.g. felt tip pens, fountain pens, paint brushes) or by other techniques known in the art such as screen printing. It will be apparent that the particular technique of applying the aqueous ink will depend upon the desired application and the demands thereof.

The aqueous inks suitable for use in the present invention comprise an aqueous carrier medium and a solubility altering agent. Other components may be present in the inks as discussed hereinbelow.

Aqueous Carrier Medium

The aqueous carrier medium comprises water (preferably deionized water) or a mixture of water and at least one water soluble organic solvent. Most preferred are organic solvents having at least one hydroxyl group (diethylene glycol, triethylene glycol, butyl carbitol, etc.). Selection of a suitable mixture of water and water soluble organic solvent depends upon the requirements of the specific application, such as desired surface tension and viscosity, drying time of the ink, and the composition of the non-photosensitive layer.

The aqueous carrier medium will usually contain from about 5% to about 95% water, with the remainder (i.e., 95% to about 5%) being the water soluble organic solvent. For ink jet printing applications, the preferred ratios are approximately 60% to about 95% water, based on the total weight of the aqueous carrier medium. Higher concentrations of organic solvent may result in poor print quality. Lower concentrations will lead to drying out of the printhead or "crusting" of the ink if the active ingredients are solids.

The aqueous carrier medium is present in the range of approximately 10 to 99%, preferably approximately 60 to 99% and most preferably approximately 70 to 98.5%, based on total weight of the ink. The amount of aqueous carrier medium in a particular ink will largely be dependent upon the amount of salt-forming agent needed to form the soluble polymer salt. The presence of other ink ingredients as described herein will also influence the concentration of the aqueous carrier medium.

Solubility Altering Agents

The solubility altering agent may be a salt-forming agent such as a base when the non-photosensitive layer contains poly(amic acid), or an acid-forming agent such as acid when the polymer in the non-photosensitive layer is a salt of poly(amic acid).

Salt-Forming Agents

The salt-forming agent is selected based upon its ability to react with the acid moieties on the poly(amic acid) to form an aqueous soluble salt. The preferred salt-forming agents are organic or inorganic bases, such as alkali metal hydroxides (lithium, sodium, and potassium hydroxide); alkali metal carbonates and bicarbonates (sodium and potassium bicarbonate and carbonate); organic amines (mono-, di-, tri-methylamine, morpholine, N-methylmorpholine); organic alcohol amines (dimethyl-ethanolamine, methyl diethanolamine, mono-, di-, tri-ethanolamine); ammonium salts (ammonium hydroxide, tetra-alkylammonium hydroxide) and pyridine.

The amount of salt-forming agent in the aqueous ink must be sufficient to form a water soluble salt with the polymer in the non-photosensitive layer, which will vary depending upon the particular salt-forming agent selected, the composition of the non-photosensitive polymer layer, the thickness of the polymer layer, etc. One of ordinary skill in the art is capable of determining the optimum amount of salt-forming agent for a given application by routine experimentation. Generally, the salt-forming agent will be present in a range of 1–90% by weight based upon the total weight of the ink composition.

Acid-forming Agent

A variety of acids may be used for reacting with the salt form of poly(amic acid) in the non-photosensitive layer and coverting it to the insoluble acid form. Examples of acids include organic acids such as acetic acid, propionic acid, formic and oxalic acid; hydroxylated acids such as glycolic acid and lactic acid; halogenated acids such as hydrochloric acid and hydrobromic acid; and inorganic acids such as sulfuric acid, phosphoric acid and nitric acid. The amount of the acid in the aqueous ink must be sufficient to convert the salt groups of the polyamic acid into acid groups to the extent that the non-photosensitive layer becomes insoluble in the developer solution, which will vary depending on the particular acid selected, the composition of the non-photosenstive layer, the degree of neutralization of the polyamic acid, the thickness of the non-photosensitive layer, etc. One skilled in the art is capable of determining the optimum amount for a given application by routine experimentation. Generally the acid is present in the range of 1–90% by weight based on the total weight of the ink composition.

Other Ingredients

In certain applications, it may be desirable for the ink to contain a colorant to give a visual indication of the image prior to the development step. Suitable ink colorants must be water-soluble or water-dispersible so as to be removed during the wash-off step, and may comprise dyes or pigments. If the pigment is not itself water-dispersible, a dispersant may be used. The colorant must also be compatible with the other ink ingredients so as to remain dissolved or dispersed therein.

Other ingredients, such as biocides, humectants, surfactants, viscosity modifiers, etc. may be present in the ink composition, if desired. Such compounds have long been used in ink formulations, particularly ink jet inks. Surfactants may be used to control the interactions between the ink and the non-photosensitive layer. Such interactions in turn determine the size and the shape of the image dots. Many water compatible surfactants are commercially available and may be selected from McCutcheon's Emulsifiers and Detergents, published by Manufacturing Confectioners Publishing Company, Glen Rock, N.J. Care must be exercised, however, to ensure that the final ink composition does not interfere with the chemistry of the solubility altering agent in the imaged areas of the non-photosensitive layer.

Ink Properties

For ink jet ink applications, the physical properties of the ink should be compatible with a wide range of ejecting conditions, i.e., driving voltage and pulse width for thermal ink jet printing devices, driving frequency of the piezo element for either a drop-on-demand device or a continuous device, and the shape and size of the nozzle.

For ink jet printing, the ink needs to be thin with viscosity matching the printhead design to ensure smooth delivery of ink droplets. Useful viscosities for the typical printheads are below 20 cP, preferably below 10 cP at 20° C. Surface tension is an important property because it prevents the ink from dripping out of the nozzles and helps maintain droplet integrity to avoid splattering. Useful surface tension ranges from 18–80 dynes/cm, preferably 25–70 dynes/cm at 20° C. Other viscosity and surface tension criteria will be applicable for other methods of applying the ink to the non-photosensitive layer and will be well known to those skilled in such methods.

Some of the solubility altering agents listed above can adversely react with the materials commonly used for printheads in ink jet ink printers because of their extreme pH values. Printheads used in thermal excitation printers in particular are susceptible to attack by such compounds. In such circumstances, it is possible to mask the solubility altering agent with a relatively volatile component to alleviate the adverse effects and then evaporate the volatile compound with heat after the ink has been applied to release the solubility altering agent.

As an example, a high boiling or solid base, such as triethanolamine (boiling point 190°to 93° C./5 mm), can be neutralized with a more volatile or lower boiling acid, such as acetic acid (boiling point 116°to 118° C.), to a more reasonable pH and significantly deactivated at the same time. After the ink is applied to the non-photosensitive layer, heat is applied for a short time to decompose the neutralized amine, flash off the volatile acetic acid, and release the free amine which reacts with the polymer to form the soluble polymer salt.

Wash-Off Development

After the element has been imaged with the aqueous ink, the soluble areas (i.e., the imaged areas in the positive-working element and the non-imaged areas in negative-working element) are removed with an aqueous solution, preferably water. If necessary, the resulting aqueous solution may contain a low level of a solubility altering agent, preferably the same agent used in the aqueous ink to facilitate the removal of the soluble areas without deleteriously affecting the insoluble areas. Optionally, low levels of water soluble surfactants may be present in the process solution to facilitate the interaction between the salt-forming agent and the polymer.

Imidization

The patterned poly(amic acid) coating is then converted to polyimide either by thermal curing or chemical treatment. The thermal curing is preferred because it's a cleaner process and superior properties in the finished product are obtained. The thermal curing is usually conducted continuously or stepwise under a nitrogen atmosphere or in vacuum, at a temperature of 150°to 450° C. for 0.5 to 5 hours. As an example, one of the most popular curing cycle consists of one hour at 100° C., followed by one hour at 200° C. followed by one hour at 300° C. At this stage, the poly(amic acid) is converted to high molecular weight polyimide with desirable properties.

Thin coatings of poly(amic acid) can also be effectively imidized by chemical treatment. The poly(amic acids) are converted to the corresponding polyimides at ambient temperature by treatment with mixtures of aliphatic carboxylic acid dianhydrides and tertiary amines. Acetic anhydride and pyridine or triethylamine are normally used. In this case, the mixture can diffuse into the swollen film and affect imidization. Although this chemical method does not have the energy requirements of thermal curing, it is generally not used commercially because of the problems associated with handling the reagents.

EXAMPLES

This invention will be further illustrated by, but not limited to, the following detailed examples of various embodiments, in which parts and percentages are by weight unless otherwise noted.

EXAMPLE 1

ODA/6-FDA poly(amic acid) was synthesized by the following procedure:

Under nitrogen in a 250 mL three-necked flask, 4.00 g (2.0 mmol) of 4,4'-oxydianiline (ODA) and 50.0 g of tetrahydrofuran were mechanically stirred until all of the solids dissolved. Stirring was maintained while 8.88 g (2.0 mmol) of 2,2'-bis-(3,3',4,4'-biphenyl) hexafluoroprapane dianhydride (6-FDA) were added. As the polymerization proceeded to give the poly(amic acid), the solution viscosity increased resulting in a very viscous taffy-like consistency. At this point, 23.0 g of additional tetrahydrofuran were added and the reaction was stirred for an additional 4 hours. The resulting polymer solution (15% solids) was then directly used in the coating preparation.

Poly(amic acid) coatings were prepared using the following procedures:

The ODA/6-FDA poly(amic acid) polymer solution was coated directly onto 5 mil thick Kapton® film using a doctor knife. The coatings were air dried. Coatings of 3 different thickness were prepared by using knifes with different gaps as indicated below.

| Coating # | Knife gap (mils) | Dried Film Thickness (microns) |
|---|---|---|
| I | 2 | 7–9 |
| II | 4 | 10 |
| III | 6 | 13–14 |

EXAMPLE 1

The poly(amic acid) coatings were imaged using the following procedure:

Coating#I–III were printed with an ink of 30% diisopropylaminoethanol in deionized water using a Hewlett Packard Deskjet ink jet printer (Hewlett Packard Co., Palo Alto, Calif.). Immediately after printing, the samples were rinsed under running tap water with gentle rubbing. Within seconds, the imaged areas were washed off to reveal alphanumerical characters and various dot patterns with sharp edges. Microscopic pictures (125×) showed that the imaged areas were washed off clearly to the substrate. The fully developed samples were ready for curing imidization.

EXAMPLE 2

Example 1 was repeated with the following exception: 15% N,N-dimethylaminoethanol was used instead of the 30% diisopropylaminoethanol.

EXAMPLE 3

Example 1 was repeated with the following exception: Ethanolamine solution (Electrosol®85, manufactured by Du Pont Howson Co., Leeds, England) was used instead of the 30% diisopropylaminoethanol in deionized water.

What is claimed is:

1. A method for preparing a high resolution wash-off polyimide image comprising the sequential steps of:
   (a) providing a non-photosensitive layer on a substrate, said non-photosensitive layer comprising a compound selected from the group consisting of a substantially non-crystalline poly(amic acid) polymer and a salt of the substantially non-crystalline poly(amic acid) polymer;
   (b) applying an aqueous ink imagewise to the non-photosensitive layer to change its solubility in the ink-applied areas, said aqueous ink comprising an aqueous carrier medium and a solubility altering agent;
   (c) washing the non-photosensitive layer with an aqueous solution to remove the soluble areas of the non-photosensitive layer; and
   (d) curing the poly(amic acid) polymer to form a polyimide layer.

2. The method of claim 1 wherein the non-photosensitive layer contains a substantially non-crystalline poly(amic acid) polymer and the solubility altering agent is a salt-forming agent.

3. The method of claim 1 wherein the non-photosensitive layer contains a salt of a substantially non-crystalline poly(amic acid) polymer and the solubility altering agent is an acid.

4. The method of claim 1 wherein the poly(amic acid) polymer is converted to the polyimide by thermal curing.

5. The method of claim 1 wherein the poly(amic acid) polymer is converted to the polyimide by chemical treatment.

6. The method of claim 1 wherein the poly(amic acid) is prepared by reacting a tetracarboxylic dianhydride with a diamine in an organic solvent.

7. The method of claim 6 wherein the tetracarboxylic dianhydride is represented by the formula:

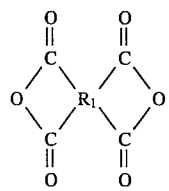

wherein $R_1$ is a tetravalent organic group having 2 to 22 carbon atoms.

8. The method of claim 6 wherein the diamine is represented by the formula:

$$H_2N-R_2-NH_2$$

wherein $R_2$ is a divalent organic group having 1 to 22 carbon atoms.

9. The method of claim 1 wherein the poly(amic acid) further comprises a siloxanediamine.

10. The method of claim 1 wherein the salt of the substantially non-crystalline poly(amic acid) polymer is prepared by reacting the poly(amic acid) polymer with a salt-forming agent.

11. The method of claim 1 wherein the poly(amic acid) or salt thereof is present in the amount of 50 to 100%, based on the total weight of the non-photosensitive layer.

12. The method of claim 1 wherein the non-photosensitive layer contains at least one additive selected from the group consisting of colorants, plasticizers, polymeric modifiers, adhesion promoters, coating aids, chelating compounds, and inorganic fillers.

13. The method of claim 1 wherein the aqueous carrier medium is water or a mixture of water and at least one water soluble organic solvent.

14. The method of claim 1 wherein the solubility altering agent is a salt-forming agent.

15. The method of claim 14 wherein the salt-forming agent is selected from the group consisting of organic or inorganic bases, alkali metal carbonates and bicarbonates, organic amines, organic alcohol amines, ammonium salts, and pyridine.

16. The method of claim 1 wherein the solubility altering agent is an acid.

17. The method of claim 16 wherein the acid is selected from the group consisting of organic acids, hydroxylated acids, halogenated acids, and inorganic acids.

18. The method of claim 1 wherein the solubility altering agent is present in the amount of 1 to 90% by weight, based on the total weight of the ink composition.

19. The method of claim 1 wherein the aqueous ink has a viscosity less than 20 cP and a surface tension of 18 to 80 dynes/cm.

20. The method of claim 1 wherein the poly(amic acid) is thermally cured at a temperature of 100° to 450° C. for 0.5 to 5 hours.

21. The method of claim 1 wherein the poly(amic acid) is chemically treated with a mixture of aliphatic carboxylic acid dianhydride and tertiary amine.

* * * * *